(12) United States Patent
Shaya et al.

(10) Patent No.: US 8,570,699 B2
(45) Date of Patent: Oct. 29, 2013

(54) RELAYLESS AND FUSELESS JUNCTION BOX

(75) Inventors: Chadi Shaya, Sterling Heights, MI (US); Jeffrey Battistella, Canton, MI (US)

(73) Assignee: Lear Corporation, Southfield, MI (US)

( * ) Notice: Subject to any disclaimer, the term of this patent is extended or adjusted under 35 U.S.C. 154(b) by 1323 days.

(21) Appl. No.: 10/907,963

(22) Filed: Apr. 22, 2005

(65) Prior Publication Data

US 2006/0238938 A1    Oct. 26, 2006

(51) Int. Cl.
    *H02H 3/08*      (2006.01)
    *H02H 5/04*      (2006.01)

(52) U.S. Cl.
    USPC ............................ 361/93.1; 361/93.8

(58) Field of Classification Search
    USPC .................................. 361/93.1, 93.8
    See application file for complete search history.

(56) References Cited

U.S. PATENT DOCUMENTS

| | | | | |
|---|---|---|---|---|
| 3,982,242 | A * | 9/1976 | Sheffield et al. | 340/512 |
| 5,418,435 | A * | 5/1995 | Yamada | 315/308 |
| 5,894,394 | A * | 4/1999 | Baba et al. | 361/87 |
| 6,102,000 | A * | 8/2000 | Shindoh et al. | 123/381 |
| 6,166,460 | A | 12/2000 | Chutorash | |
| 6,335,577 | B1 * | 1/2002 | Baba | 307/28 |
| 6,441,557 | B1 * | 8/2002 | Asakura | 315/149 |
| 6,876,043 | B1 * | 4/2005 | Sander | 257/378 |
| 2001/0049211 | A1 | 12/2001 | Sumida et al. | |
| 2002/0009907 | A1 | 1/2002 | Kasai et al. | |
| 2002/0010999 | A1 | 1/2002 | Kobayashi et al. | |
| 2002/0028590 | A1 | 3/2002 | Saito et al. | |
| 2002/0030036 | A1 | 3/2002 | Kasai | |
| 2002/0050375 | A1 | 5/2002 | Sumida et al. | |
| 2002/0064975 | A1 | 5/2002 | Saito et al. | |
| 2002/0064976 | A1 | 5/2002 | Saito et al. | |
| 2002/0102871 | A1 | 8/2002 | Depp et al. | |
| 2002/0153372 | A1 | 10/2002 | Depp et al. | |
| 2003/0017727 | A1 | 1/2003 | Seo et al. | |
| 2003/0205397 | A1 | 11/2003 | Sumida et al. | |
| 2003/0205398 | A1 | 11/2003 | Sumida et al. | |
| 2004/0121623 | A1 | 6/2004 | Kato et al. | |
| 2004/0219806 | A1 | 11/2004 | Kobayashi | |
| 2005/0013095 | A1 | 1/2005 | Oda | |

FOREIGN PATENT DOCUMENTS

| | | |
|---|---|---|
| DE | 19530664 A1 | 3/1996 |
| EP | 1 245 455 A3 | 3/2004 |
| GB | 2 370 701 A | 7/2002 |
| WO | 02051668 A1 | 7/2002 |

OTHER PUBLICATIONS

Shin Kiuchi, Minoru Nishio, Takanori Kohama, "Automotive Smart MOSFETs", Fuji Electric Review, vol. 50, N0.2, pp. 58-63.*

* cited by examiner

*Primary Examiner* — Jared Fureman
*Assistant Examiner* — Lucy Thomas
(74) *Attorney, Agent, or Firm* — Brooks Kushman P.C.

(57) ABSTRACT

A relayless and fuseless junction box or power distribution unit. The junction box configured to perform operations associated with fuses and relays without the short-comings associated with the operations thereof.

23 Claims, 2 Drawing Sheets

RELAYLESS AND FUSELESS JUNCTION BOX

BACKGROUND OF THE INVENTION

1. Field of the Invention

The present invention relates to relayless and fuseless junction boxes and power distribution units.

2. Background Art

Junctions boxes and power distribution units are units commonly used to distribute or relay power and other electrical signals to one or more subsystem. The units typically include one or more mechanical relays and one or more fuses. The relays are typically used to open and close high current electrical connections and the fuses are typically used to generate open circuits during fault conditions, such as to provide protection to a load.

Fuses tend to be one-use items which must be replaced if opened during fault conditions, i.e., if the fuse blows. The replacement or rework of blown fuses can be problematic and expensive. Fuses may fail to provide feedback or other empirical indicators which may be useful in diagnosing the fault conditions that cause the fuse to blow. Fuses also fail to provide early warning indicators prior to the occurrence of such fault conditions.

Relays tend to be relatively expensive items which require removal or rework should they fail or otherwise require repair. Their mechanical nature tends to limit control functionality and often results in instable load current characteristics, such as in-rush, ripple, noise, etc.). The opening of relays may also be problematic in that the relays tend to bounce rather than immediately shutting off the current supply, causing spikes and other trickle currents to keep flowing to the subsystem associated therewith.

Relays and fuses tend to be fairly large in size and consume corresponding large portions of printed circuit boards (PCBs). This can lead to design constraints and other problems associated with packaging the PCBs in vehicles and other environments. Relays and fuses tend to have short lead time to fail, forcing OEMs to make the PCB, fuses, and relays serviceable and accessible by the user.

SUMMARY OF THE INVENTION

One non-limiting aspect of the present invention relates to providing relayless and fuseless junctions boxes and power distribution units so as to overcome the above-identified deficiencies units having such features.

One aspect of the present invention relates to a relayless and fuseless junction box. The junction box may be configured to distribute electrical signals to at least one output as a function of signals received by one or more inputs. The junction box may include at least one switch associated with at least output which may be configured to open and close in response to control signals communicated thereto, such as to control the distribution of electrical signals the output associated therewith. The junction box may further include at least one sensor associated with each switch for sensing operating conditions of the associated switch and a processor in communication with each switch and sensor to control the opening and closing thereof. The processor may include logic for opening and closing the switches as a function of the operating conditions associated therewith and independently of the signals received by the one or more inputs.

The sensors may be embedded on the switches. The switches may be field effect transistors (FETs). The switches, sensors, and processor may be mounted on a printed circuit board so as to provide a relayless and fuseless printed circuit board.

The processor may include current control logic for controlling switch opening as a function of sensed current operating conditions. The current control logic may be configured to determine whether current sensed by one or more of the sensors is greater than a current threshold and to open the switches if the sensed current is greater than the current threshold associated therewith. The current control logic may be further configured to diagnosis over current conditions if the sensed current is greater than the current threshold associated with the switch. The current control logic may be configured to determine a diagnosis code for the diagnosed over current conditions. The current control logic may be configured to test continued operation of switches associated with over current conditions.

The processor may include temperature control logic for controlling switch opening as a function of sensed temperatures. The temperature control logic may be configured to determine whether temperature sensed by one or more of the sensors is greater than a temperature threshold and to open the switches if the sensed temperature is greater than the temperature threshold associated therewith. The temperature control logic may be configured to diagnosis over temperature conditions if the sensed temperature is greater than the temperature threshold associated with the switch. The temperature control logic may be configured to test continued operation of switches associated with over temperature conditions.

One aspect of the present invention relates to a method of operating a relayless and fuseless junction box configured to distribute electrical signals to at least one output as a function of signals received by one or more inputs. The method may include controlling at least one switch to distribute electrical signals to at least one output as a function of signals received by the one or more inputs, determining a fault condition for at least one switch as a function of operating conditions associated therewith, opening the switch associated with the fault condition, the switch opening overriding control of the switch by the one or more inputs, and testing continued operation of the switch associated with the fault condition.

The method may further including testing continued operation of the switch by limiting operating parameters of the switch and testing for continued fault conditions thereafter, such as by successively limiting operating parameters until the fault condition ceases so as to provided limp-home functionality. The may further included testing continued operation of the switch by repeatedly closing and opening the switch associated with the fault condition.

The above features and advantages, along with other features and advantages of the present invention, are readily apparent from the following detailed description of the invention when taken in connection with the accompanying drawings.

DETAILED DESCRIPTION OF THE PREFERRED EMBODIMENT(S)

Figure 1:
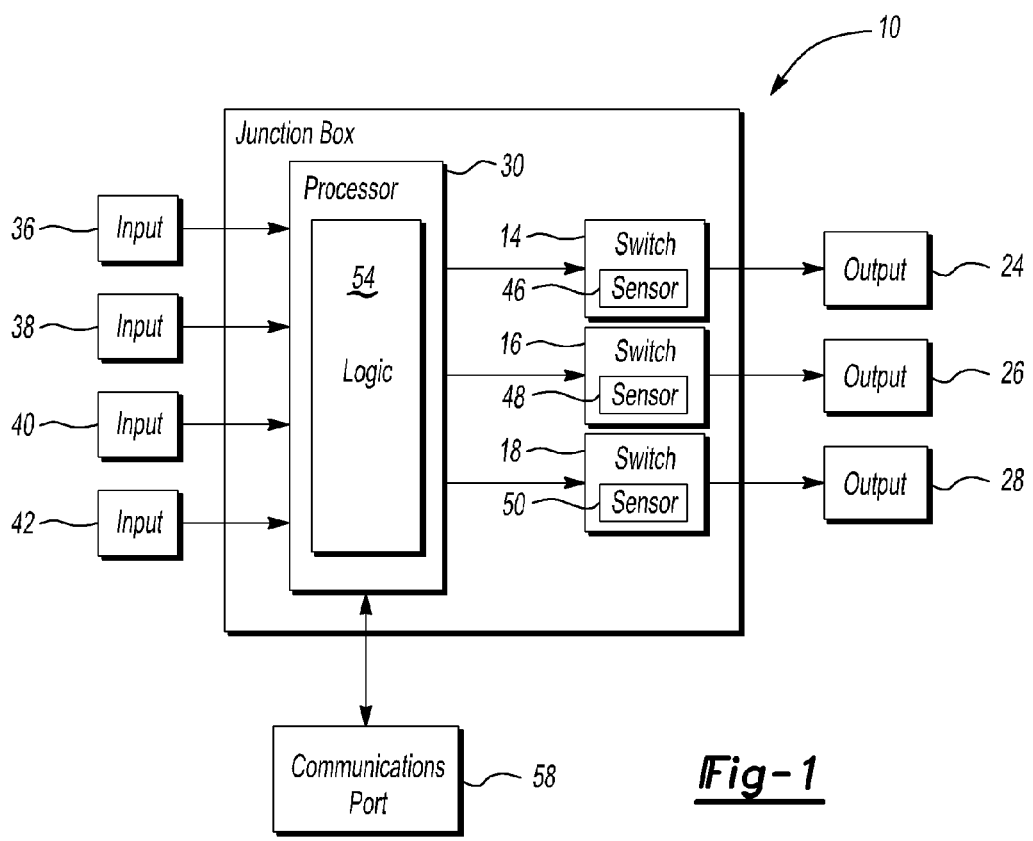
FIG. 1 illustrates a relayless and fuseless junction box in accordance with one non-limiting aspect of the present invention.

FIG. 1 illustrates a relayless and fuseless junction box 10 in accordance with one non-limiting aspect of the present invention. The junction box 10 includes a number of electronic switches 14-18 for providing power distribution to a number of outputs 24-28. The opening and closing of the switches 14-18 may be controlled by a processor 30 as function of signals a received from inputs 36-42 thereto.

The present invention contemplates the junction box 10 including any number of switches 14-18 and features for controlling electrical transmissions to the outputs 24-28. Likewise, the junction box 10 may include any number of features and configurations for manipulating or otherwise reconfiguring the electrical signals in communication therewith.

The junction box 10 may be configured to operate in any number of environments and to support any number of operations. The junction box 10, which may be referred to as a power distribution unit, may be of the type commonly found in automobiles and other vehicles where multiple power distributions wires and connectors connect to the junction box outputs 24-28 to receive power from one or more power sources (not shown) associated with the junction box 10. For example, various vehicle control features may be in communication with the inputs 36-42 for requesting power distribution to the outputs 24-28 such that the processor 30 receives the input requests and performs any number of operations to distribute the requested power to the associated outputs 24-28, i.e., by closing the switches 14-18 associated therewith.

Of course, the present invention contemplates any number of configurations and features for the junction box 10 and is not intend to be limited to the foregoing. The present invention contemplates the use of the junction box 10 in any number of locations, environment, and applications and is not intended to be limited to the foregoing.

The switches 14-18 may include any number of configurations and features for supporting the transmission of electrical signals to the outputs 24-28. The switches 14-18 may include sensors 46-50, processors (not shown), logic (not shown), or other features to support the operation thereof. These features may be packaged within an integrated circuit and mounted on a printed circuit board, such as to provide an integrated circuit having a dual-in-line package (DIP).

The switches 14-18 may be characterized as relayless and fuseless devices in that they may provide functionality associated with relays and fuses but without the same shortcomings.

The switches 14-18 may be opened and closed to control distribution of electrical signals to outputs (i.e., to provide relay functionality) and they may be opened during a fault condition to prevent the distribution of electrical signals to outputs (i.e., to provide fuse functionality).

The switches 14-18 may be solid-state devices, such as transistors or field effect transistors (FETs), commonly referred to as smart FETs. The switches 14-18 may be referred to a smart devices in that they are configured to be controlled with signals emitted from the processor or based on other logical entities in communication therewith.

The sensors 46-50 may be configured to monitor any number of operating conditions associated with the switches 14-18, such as current flow and switch temperature levels.

The processor 30 may communicate with the switches 14-18 and sensors through a number of communication lines. The switches 14-18 and sensor 46-50 may also communicate with the processor 30 through a common communication bus (not show) or other multiple access communication medium.

The processor 30 may include logic 54 for controlling its operation and the operation of the switches 14-18. The logic 54 may specify any number of operating and control applications. The logic 54 may include features for controlling the opening and closing of the switches 14-18 so as to control the electrical communication to the outputs 24-28. The switches 14-18 may include registers or other features which provide hard-wired logic or other features to support or backup operations associated opening and closing the switches 14-18, such as to provide fault protection and switch opening in the event of failure of the processor 30 or logic 54 (i.e., to protect against the loads experience over current or voltage conditions).

The junction box 10 may include a communications port 58 for communicating with the processor 30. The communications port 58 may be used by external devices to program the processor 30 and to receive information therefrom. The present invention contemplates the processor 30 including logic 54 for diagnosing fault conditions in the switches 14-18 such that the fault conditions may be communicated to a computer or other individual through the communications port 58, such as to facilitate vehicle repair and troubleshooting.

The opening of the switches 14-18 may be controlled by the processor 30 so as to meter the amount of current flowing therethrough. This may be advantageous to limiting the exposure of output connected system to high on-currents or other initial currents. The processor 30 may control a voltage level or other operating parameter of the switches 14-18 in order to control the opening thereof. The voltage level may be modulated or otherwise gradually increased to gradually increase the current permitted to pass therethrough to the output systems, thereby, limiting the on-current or initial current exposure of the output systems. The voltage levels may also be controlled to limit current levels in the event that the switches 14-18 begin to degrade, such as to provide limp-home functionality. The opening of the switches 14-18 may be controlled by the processor 30 so as to limit bounce and other operations which tend to result in current spikes or other trickle currents reaching the output system after the switch is opened.

The opening and closing of the switches 14-18 maybe controlled by the processor 30 to provide reusable fuse operations. This may be advantageous during fault conditions in that the switches 14-18 may be opened during the fault condition to protect against damage and thereafter closed by the processor 30 after the error has be corrected. The ability to close the switches 14-18 without replacement is advantageous as such capabilities reduce replacement and rework costs.

The processor 30 may also include logic for monitoring the operating conditions attendant with the fault conditions so as to provide feedback that may be used to diagnosis error states. The processor 30 may, for example, assign diagnosis codes as a function of various fault conditions. The diagnosis codes may then be outputted through the communication port for analysis.

The diagnosis codes may include any number of parameters and may be associated with any number of error detection triggers. For example, the diagnosis codes may be associated with current related conditions, such as open conditions (no current flow), high current errors (i.e., different codes for varying current levels), shorts to ground, shorts to battery, and the like. The diagnosis codes may be associated with temperature related conditions, such as junction temperatures, package temperatures, and the like.

Figure 2:
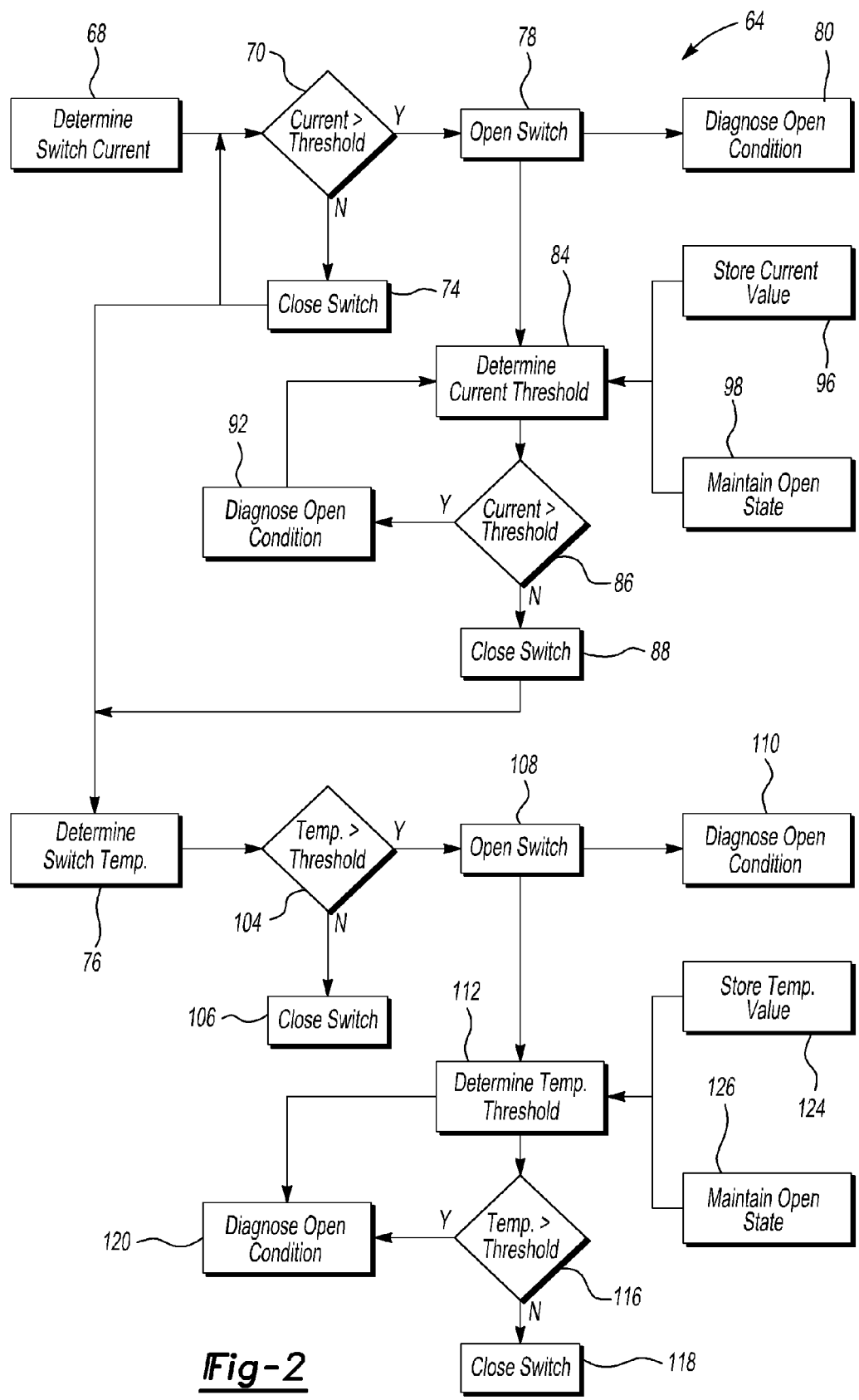
FIG. 2 illustrates a flowchart of a method of controlling operation of a junction box in accordance with one non-limiting aspect of the present invention.

FIG. 2 illustrates a flowchart 64 of a method of controlling the switches 14-18 in accordance with one non-limiting aspect of the present invention. The method may be embodied in logic 54 or other functional aspects associated with operation of the processor 30. The logic 54 may be configured to prompt, instruct, or otherwise initiate operation of the processor 30, switches 14-18, and/or sensors 46-50 in accordance the operations described below.

The method described below relates to controlling the operation of one of the switches. However, the present invention is not intended to be limited to the processor controlling on one switch. The present invention contemplates any number of other applications, including simultaneously controlling and analyzing operation of one or more of the switches according to the operations described below.

One aspect of the method relates to a current monitoring operation where current passing through the switch is monitored to determine whether the switch 14-18 should be opened as a function thereof. This may be analogous to performing fuse operations in that the switch 14-18 may be opened if current levels rise above a predefined level.

Block 68 relates to determining a first switch current value. The first switch current value may be associated with a range of acceptable current values. The range may be associated with the output systems connected to one or more of the outputs 24-28. The values may be selected as function of junction box operating conditions, output system operating conditions, and/or other operating conditions.

The first switch current value may be a default value associated with pre-designed operating conditions of the output subsystem connected to the switch 14-18. It may be programmed into the processor 30 through the communication port 58 and/or set as a default value, which may be advantageous in large volume vehicle manufacturing operations where it is undesirable to individually program initial operation of the junction box 10 for each vehicle.

Block 70 relates to determining whether the switch current is greater than the first switch current value. This determination may be made by the processor 30 as a function of signals received from the sensors 46-50 associated with the switches. The sensors 46-50 may be configured to periodically output current values to the processor 30 to facilitate this determination.

Block 74 relates to the processor 30 controlling the switch 14-18 to be closed or to remain closed if the switch current value associated therewith is less than the corresponding first switch current value assigned to it. Controlling the switch 14-18 to be closed may include closing the switch 14-18 from an open condition and/or maintaining the switch 14-18 in a closed position, i.e., the switch 14-18 is already closed. The closed switch then relays electrical signals to the associated output to provide a relay function. Optionally, if the switch 14-18 is being closed from the an open position (no current flow to the output), the processor 30 may include further logic for controlling the switch 14-18 so as to control the current exposure of the output system connected thereto.

Once the switch 14-18 is closed in block 74, the method may return to block 70 to continue current monitoring operations, such as to determine if subsequent operation causes changes in the switch current. Optionally, at block 76, a temperature monitoring operation may operate in parallel with the current monitoring operation to control opening of the switch 14-18 as a function of temperature instead of current.

Block 78 relates to opening the switch 14-18 in response to determining the switch current to be greater than the first switch current value determined in block 70. The opening of the switch 14-18 is preferably instantaneous so as to generate an open circuit between the inputs and outputs and so as to eliminate switch bounce from causing spikes and other trickle currents from continuing to flow to the output system.

Block 80 relates to diagnosing the open condition associated with opening the switch 14-18 in block 78. The diagnosis may include any number of operations and computations by the processor 30. The diagnosis may include assigning a diagnosis code to the open condition as a function of the switch current. The diagnosis code may then be stored in a memory (not show) or other feature for subsequent output through the communications port.

The diagnosis may include comparing the switch current against a look-up table stored in the processor. The look-up table may be used to cross-reference the switch current against known current levels so as to facilitate assigning a diagnosis code thereto. For example, a short to ground diagnosis code may be associated with one switch current range, a short to battery diagnosis code may be associated with another switch current range, an open circuit diagnosis code may be associated with no switch current, a high current diagnosis code may be associated with a switch current which is greater than a predefined threshold, such as twice the first current value. The present invention contemplates the use of any number of diagnosis code indicators and methods of determining the same, and therefore, is not intended to be limited to the foregoing.

Block 84 relates to determining a second switch current threshold for use in testing continued power distribution. The current threshold may determined as function of the fault diagnosis or other predefined operations. It may be lower than the first current threshold, such as to test continued operation at lower currents, and/or it may be the same as the first current value, such as to test continued operation after waiting a predefined period to time.

Intermittent shorts are common problem which may cause fuses to open due to brief error conditions. Because the shorts are intermittent, it may be advantageous to continue operating the subsystem after the initial fault condition, i.e., to provide limp-home functionality. The present invention addresses the problem by testing continued operation of the switch.

Testing continued operation of the switch 14-18 may include limiting operating parameters of the switch 14-18 and testing for continued fault conditions thereafter. For example, operating parameters may be successively limited until the fault condition ceases so as to provided limp-home functionality. Testing continued operation of the switch 14-18 may include repeatedly closing and opening the switch 14-18 associated with the fault condition.

Block 86 relates to again closing the switch 14-18 and determining whether the current level is greater than the second current threshold determined in block 84. This may comprises briefly closing the switch 14-18 to test current levels, i.e., to limit exposure of the output to high current levels in the event that the fault is not associated with an intermittent fault. If the current is below the second current threshold, then the switch 14-18 may be controlled to remain closed at block 88.

If the current level is still greater than the second current threshold, then an error diagnosis is again made at block 92. Block 84 is then returned to determine a third switch current threshold. The third current threshold may be equal to or less than the second current threshold. The third current threshold may be equal to the second current level to test output operation after waiting a predefined period of time and/or it may be less than the second current level to test output operation at a still lower current. The third current threshold may be determined in a similar manner as the second lower threshold. Optionally, a block 96 may be provided to record each successive current threshold test. These values may be incorporated into determining the current threshold values in block and/or to facilitate assigning diagnosis codes to the fault conditions.

Block 86 is again returned to test continued operation of the switch at the third current threshold. The process described above is again repeated to determine whether the switch 14-18 should be closed or open. Continued cycling through a number of test currents may continue in the event of an unsuccessful test. Testing parameters may be included within the logic to control the number of successive tests and durations therebetween.

Block 98 relates to permanently maintaining the switch 14-18 in the open position in the event of one or more unsuccessful tests. This threshold may be associated with a predefined number of unsuccessful cycles of lowering the current threshold and/or a number of unsuccessful cycles of waiting for the intermittent fault to clear. For example, if the an intermittent short is causing the over current condition, then it is likely that lowering the current threshold and/or waiting through a number of test cycles will eventually restore at least some current flow to the output system, such as to provide limp-home functionality. If the over current condition, however, is caused by a severe short or other short which result in too much current, then the switch may be opened to prevent damage.

The present invention contemplates determining the various current thresholds as a function of any number of operating conditions and parameters of the junction box 10, switches 14-18, sensors 46-50, and outputs 24-28. The degree of difference, if any, between the various current values may be based on previous current levels, such as through default decrements, and/or based on other parameters, such as fault severity, degradation, and the like. For example, lower current values may be determined for each successive test to compensate for switch degradation caused by high current exposure and/or lower current values may be determined for each successive test as a function of exposure time or switch use length so as to compensate for time-based degradation.

As described above, a temperature monitoring operation, which begins at block 76, may operate independently of or in parallel with the above describe current monitoring operation to control opening of the switch 14-18 and/or limiting of current flow to the output system connected thereto.

Block 76 relates to determining a first switch temperature value. The first switch temperature value may be associated with a range of acceptable temperature values. The range may be associated with the output systems connected to one or more of the switches 14-18. The values may be selected as function of junction box operating conditions, output system operating conditions, and/or other operating conditions.

The first switch temperature value may be a default value associated with pre-designed operating conditions of the output subsystem connected to the switch 14-18 and/or operation of the switch 14-18. The temperature values may be correlated to current levels as current through the switch 14-18 is proportional to heat generation. The first temperature threshold may be programmed into the processor 30 through the communication port 58 and/or set as a default value, which may be advantageous in large volume vehicle manufacturing operations where it is undesirable to individually program initial operation of the junction box for each vehicle.

Block 104 relates to determining whether the switch temperature is greater than the first temperature threshold. This determination may be made by the processor as a function of signals received from the sensors associated with the switches. The sensors 46-50 may be configured to periodically output temperature values to the processor 30 to facilitate this determination.

Block 106 relates to the processor 30 controlling the switch 14-18 to be closed or to remain closed if the switch temperature value associated therewith is less than the corresponding first switch temperature value assigned to it. Controlling the switch 14-18 to be closed may include closing the switch 14-18 from an open condition and/or maintaining the switch 14-18 in a closed position, i.e., the switch 14-18 is already closed. The closed switch 14-18 then relays electrical signals to the associated output to provide a relay function. Optionally, if the switch 14-18 is being closed from the an open position (no current flow to the output), the processor 30 may include further logic for controlling the switch 14-18 so as to control the current exposure of the output system connected thereto.

Block 108 relates to opening the switch 14-18 in response to determining the switch temperature to be greater than the first switch temperature value determined in block. The opening of the switch 14-18 is preferably instantaneous so as to generate an open circuit between the inputs and outputs and so as to eliminate switch bounce from causing spikes and other trickle currents from continuing to flow to the output system.

Block 110 relates to diagnosing the open condition associated with opening the switch in block. The diagnosis may include any number of operations and computations by the processor. The diagnosis may include assigning a diagnosis code to the open condition as a function of the switch temperature. The diagnosis code may then be stored in a memory (not show) or other feature for subsequent output through the communications port. The diagnosis may include comparing the switch temperature against a look-up table stored in the processor. The look-up table may be used to cross-reference the switch temperature against known temperature levels so as to facilitate assigning a diagnosis code thereto.

Block 112 relates to determining a second switch temperature threshold for use in testing continued power distribution to the output. The temperature threshold may determined as function of the fault diagnosis or other predefined operations. It may be lower than the first temperature threshold, such as to test continued operation at lower currents (which correlates to lower temperatures), and/or it may be the same as the first temperature value, such as to test continued operation after waiting a predefined period to time.

Block 116 relates to again closing the switch and determining whether the temperature level is greater than the second temperature threshold determined in block. This may comprises briefly closing the switch to test temperature levels, i.e., to limit exposure of the output to high current levels in the event that the fault is not associated with an intermittent fault. If the temperature is below the second temperature threshold, then the switch may be controlled to remain closed at block 118.

Testing continued operation of the switch 14-18 may include limiting operating parameters of the switch 14-18 and testing for continued fault conditions thereafter. For example, operating parameters may be successively limited until the fault condition ceases so as to provided limp-home functionality. Testing continued operation of the switch 14-18 may include repeatedly closing and opening the switch 14-18 associated with the fault condition.

If the temperature level is still greater than the second temperature threshold, then an error diagnosis is again made at block 120. Block 112 is then returned to determine a third switch temperature threshold. The third temperature threshold may be equal to or less than the second temperature threshold. The third temperature threshold may be equal to the second temperature level to test output operation after waiting a predefined period of time and/or it may be less than the second temperature level to test output operation at a still lower temperatures. The third temperature threshold may be determined in a similar manner as the second lower threshold. Optionally, a block 124 may be provided to record each successive temperature threshold test. These values may be incorporated into determining the temperature threshold values in block 112 and/or to facilitate assigning diagnosis codes to the fault conditions.

Block 116 is again returned to test continued operation of the switch at the third temperature threshold. The process described above is again repeated to determine whether the switch 14-18 should be closed or open. Continued cycling through a number of test temperature may continue in the event of an unsuccessful test. Testing parameters may be included within the logic 54 to control the number of successive tests and durations therebetween.

Block 126 relates to permanently maintaining the switch in the open position in the event of one or more unsuccessful tests. This threshold may be associated with a predefined number of unsuccessful cycles of lowering the temperature threshold and/or a number of unsuccessful cycles of waiting for the intermittent fault to clear. For example, if the an intermittent short is causing the over temperature condition, then it is likely that lowering the temperature threshold and/or waiting through a number of test cycles will eventually restore at least some current flow to the output system, such as to provide limp-home functionality. If the over temperature condition, however, is caused by a severe short or other short which result in too much current, then the switch may be opened to prevent damage.

The present invention contemplates determining the various temperature thresholds as a function of any number of operating conditions and parameters of the junction box 10, switches 14-18, sensors 46-50, and outputs 24-28. The degree of difference, if any, between the various temperature values may be based on previous temperature levels, such as through default decrements, and/or based on other parameters, such as fault severity, degradation, and the like. For example, lower temperature values may be determined for each successive test to compensate for switch degradation caused by high temperature exposure and/or lower temperature values may be determined for each successive test as a function of exposure time or switch use length so as to compensate for time-based degradation.

What is claimed is:

1. A relayless and fuseless junction box configured to distribute power to at least one output as a function of signals received from one or more inputs, the box comprising:
   at least one switch associated with at least one output, each switch configured to open and close in response to control signals communicated thereto so as to control power distribution to the associated output;
   a processor in communication with each switch to control switch opening and closing as a function of the signals received from the one or more inputs;
   a sensor associated with each switch for sensing switch operating conditions, the sensors being separate from the processor and configured for opening the associated switch if the switch operating conditions are above a threshold, the sensors controlling switch opening independently of processor switch controls; and
   wherein current is one of the operating conditions sensed by the sensors and wherein the sensors are configured to automatically adjust the threshold as a function of the sensed current.

2. The junction box of claim 1 wherein the sensors are embedded on the switches.

3. The junction box of claim 1 wherein the switches, sensors, and processor are mounted on a printed circuit board and wherein the printed circuit board is relayless and fuseless.

4. The junction box of claim 1 wherein the processor includes current control logic for controlling switch opening as a function of sensed current operating conditions.

5. The junction box of claim 4 wherein the current control logic is configured to determine whether current sensed by one or more of the sensors is greater than a current threshold and to open the switches if the sensed current is greater than the current threshold associated therewith.

6. The junction box of claim 5 wherein the current control logic is further configured to diagnosis over current conditions, the over current conditions being determined if the sensed current is greater than the current threshold associated with the switch.

7. The junction box of claim 6 wherein the current control logic is configured to determine a diagnosis code for the diagnosed over current conditions.

8. The junction box of claim 5 wherein the current control logic is configured to test continued operation of switches associated with over current conditions, the over current conditions being determined if the sensed current is greater than the current threshold associated with the switch.

9. The junction box of claim 8 wherein the current control logic is configured to test continued switch operation as a function of the previously determined over current condition.

10. The junction box of claim 1 wherein the processor includes temperature control logic for controlling switch opening as a function of sensed temperatures.

11. The junction box of claim 10 wherein the temperature control logic is configured to determine whether temperature sensed by one or more of the sensors is greater than a temperature threshold and to open the switches if the sensed temperature is greater than the temperature threshold associated therewith.

12. The junction box of claim 11 wherein the temperature control logic is further configured to diagnosis over temperature conditions, the over temperature conditions being determined if the sensed temperature is greater than the temperature threshold associated with the switch.

13. The junction box of claim 12 wherein the temperature control logic is configured to determine a diagnosis code for the diagnosed over temperature conditions.

14. The junction box of claim 11 wherein the temperature control logic is configured to test continued operation of switches associated with over temperature conditions, the over current conditions being determined if the sensed temperature is greater than the temperature threshold associated with the switch.

15. The junction box of claim 14 wherein the temperature control logic is configured to test continued switch operation as a function of the previously determined over temperature condition.

16. The junction box of claim 1 wherein the sensors are configured to sense temperature and to open the associated switch independently of processor switch controls if the sensed temperature is greater than the threshold, wherein the sensors are configured to adjust the temperature threshold according to the sensed current.

17. The junction box of claim 1 wherein the sensors are configured to close the associated switch as a function of the switch operating conditions.

18. The junction box of claim 1 wherein the processor is configured to program the switch operating conditions used by the sensors to open the associated switch independently of processor switch opening.

19. A method of operating a relayless and fuseless junction box configured to distribute power to at least one output as a function of signals received by one or more inputs, the method comprising:
controlling at least one switch to distribute power to at least one output as a function of signals received by the one or more inputs;
determining a fault condition for at least one switch as a function of operating conditions associated therewith;
opening the switch associated with the fault condition, the switch opening overriding control of the switch by the one or more inputs; and
testing continued operation of the switch associated with the fault condition, the testing including incrementally reducing power distributed to the faulted switch until persistence of the fault condition ceases.

20. The method of claim 19 further comprising closing the switch to allow continued operation of the switch and reduced power distribution to the output once persistence of the fault condition ceases.

21. The method of claim 19 further comprising incrementally reducing power distributed to the faulted switch by modulating opening and closing of the faulted switch.

22. A relayless and fuseless junction box configured to distribute power to one or more outputs, the junction box comprising:
a switch associated with each output, the switches having an open and closed state such that switch opening and closing is controllable to control power distributed to the associated outputs;
a processor configured to control switch opening and closing;
a sensor associated with each switch for sensing switch operating conditions, the sensors configured to override processor controlled switch closing as a function of the sensed switch operating conditions; and
wherein the processor is configured to determine the sensor override of processor controlled switch closing, and in response thereto, to reduce power distribution of the associated switch until the switch operating conditions allow the sensor to cease overriding the processor controlled switch closing.

23. The junction box of claim 22 wherein the processor reduces the power distribution of the switch associated with the sensor override by modulating switch opening and closing.

* * * * *